US007198673B2

(12) United States Patent
Brennan et al.

(10) Patent No.: US 7,198,673 B2
(45) Date of Patent: Apr. 3, 2007

(54) OPTICAL LITHOGRAPHY FLUORIDE CRYSTAL ANNEALING FURNACE

(75) Inventors: John H. Brennan, Horseheads, NY (US); Michael W. Price, Corning, NY (US); Juergen Tinz, Addison, NY (US); Liming Wang, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 142 days.

(21) Appl. No.: 11/059,980

(22) Filed: Feb. 16, 2005

(65) Prior Publication Data

US 2005/0139152 A1    Jun. 30, 2005

Related U.S. Application Data

(62) Division of application No. 10/611,505, filed on Jun. 30, 2003, now Pat. No. 6,997,987.

(60) Provisional application No. 60/396,779, filed on Jul. 17, 2002.

(51) Int. Cl.
*C30B 11/00* (2006.01)
(52) U.S. Cl. .............. 117/206; 117/3; 117/81; 117/83
(58) Field of Classification Search ........ 117/81, 117/83, 937
See application file for complete search history.

(56) References Cited

U.S. PATENT DOCUMENTS

| 6,201,634 | B1 | 3/2001 | Sakuma et al. ............. 359/322 |
| 6,309,461 | B1* | 10/2001 | Gianoulakis et al. ....... 117/206 |
| 6,488,769 | B1 | 12/2002 | Oba et al. ..................... 117/68 |
| 6,673,150 | B2* | 1/2004 | Garibin et al. ............. 117/223 |
| 6,702,891 | B2 | 3/2004 | Chiba ............................ 117/2 |
| 6,878,201 | B2* | 4/2005 | Oba et al. ..................... 117/76 |
| 2001/0046091 | A1 | 11/2001 | Mayolet et al. ............. 259/722 |
| 2002/0020338 | A1 | 2/2002 | Oba et al. ..................... 117/13 |

FOREIGN PATENT DOCUMENTS

EP    0869203 A    10/1998
JP    2000-026198    1/2000

* cited by examiner

*Primary Examiner*—Felisa Hiteshew
(74) *Attorney, Agent, or Firm*—Walter M. Douglas

(57) ABSTRACT

A method of making below 250-nm UV light transmitting optical fluoride lithography crystals includes applying heat along a shortest path of conduction of a selected optical fluoride crystal, heating the optical fluoride crystal to an annealing temperature, holding the temperature of the optical fluoride crystal at the annealing temperature, and gradually cooling the optical fluoride crystal to provide a low-birefringence optical fluoride crystal for transmitting below 250-nm UV light.

17 Claims, 15 Drawing Sheets

OPTICAL LITHOGRAPHY FLUORIDE CRYSTAL ANNEALING FURNACE

PRIORITY

This application is a division of and claims the priority of U.S. application Ser. No. 10/611,505, filed Jun. 30, 2003, now U.S. Pat. No. 6,997,987 and titled "OPTICAL LITHOGRAPHY FLUORIDE CRYSTAL ANNEALING FURNACE", which in turn application claims the priority of U.S. Provisional application No. 60/396,779, filed Jul. 17, 2002, titled "Optical Lithography Fluoride Crystal Annealing Furnace".

BACKGROUND OF INVENTION

1. Field of the Invention

The invention relates to methods and apparatus for producing optical crystals. In particular, the invention relates to a method and an apparatus for annealing optical crystals, particularly optical lithography fluoride crystals for transmitting below 250-nm UV light.

2. Background Art

Optical crystals are commonly grown using the Stockbarger-Bridgman method. In the Stockbarger-Bridgman method, the optical crystals are grown in a vertical furnace by moving molten crystal material through a temperature gradient zone in the furnace. The method is further explained below with reference to FIGS. 1A and 1B.

FIG. 1A shows a vertical furnace 1 having an upper zone 2 and a lower zone 3. Heating jackets 4, 5 are provided in the upper and lower zones 2, 3, respectively. The heating jackets 4, 5 are operated such that a temperature gradient zone 6 is created between the upper and lower zones 2, 3. At the start of the growth process, a crucible 7 containing a crystal raw material F is mounted in the upper zone 2. The crystal raw material F is melted by heat from the heating jacket 4. After melting the crystal raw material F, the crucible 7 is lowered into the lower zone 3, as shown in FIG. 1B. As the crucible 7 passes from the upper zone 2 into the lower zone 3, the molten material M goes through the temperature gradient zone 6. On passing through the temperature gradient zone 6, the temperature transition inside the molten material M creates a crystallization front CF. The crystallization front CF propagates inside the crucible 7, within the molten material M, as long as the crucible 7 continues to move downwardly.

Crystals grown using the method described above are exposed to sharp localized cooling as they are translated through the temperature gradient zone into the lower zone. Sharp localized cooling induces permanent thermal strain (or stress) in the crystals, which can result in unacceptably elevated values in birefringence of the crystals. To reduce the permanent thermal strain in the crystal, the crystal is annealed in the lower zone of the growth furnace. The annealing cycle includes re-heating the crystal to a temperature below the melting temperature of the crystal, holding the crystal at this temperature until the thermal strain induced in the crystal by the sharp localized cooling is dissipated, and then slowly cooling the crystal to a temperature below which any strain due to additional cooling to room temperature will result only in temporary strain in the crystal.

The duration of the annealing cycle depends on the volume of the crystal. As the volume of the crystal increases, the ability to completely anneal the crystal inside the growth furnace such that the birefringence of the crystal meets the specification reduces. For instance, exposure systems in microlithography processes require optical crystals, mainly fluoride crystals, with birefringence values of 3 nm/cm or lower. To meet such stringent specifications for large-volume crystals, the growth furnace would have to be tied up for extended times, which would have a great impact on the ability to meet market demands. Therefore, the current practice is to anneal the crystal for a relatively short time in the growth furnace. The birefringence of the crystal is then measured. If the crystal has an unacceptably high birefringence value, the crystal is further annealed in a separate furnace from the growth furnace. This process is typically referred to as post-annealing.

A typical annealing furnace is a vertical furnace in which a vertical stack of individual hermetically-sealed containers can be supported during post-annealing. The furnace includes heaters for creating a desired temperature profile inside the furnace. In operation, the crystals to be annealed are loaded into the sealed containers, and the sealed containers are loaded into the annealing furnace. A vacuum, inert, or fluorinating atmosphere may be provided inside the sealed containers. The annealing process starts by heating the crystals to a temperature below the melting point of the crystals. The crystals are held at this temperature for a predetermined length of time before being slowly cooled to room temperature. Typically, the heaters used in the process are circumferential heaters, which are arranged in the furnace so as to circumscribe the individual containers. In addition, heaters or thermal insulators can be placed at the top and bottom of the stack of containers.

The annealing cycle can be relatively short if the crystals in the stack have small diameters, e.g., less than 150 mm. This is because the path of conduction from the circumference of the crystals, where the heat is applied, to the center of the crystals is relatively short. Thus, the heating rates from room temperature to annealing temperature and the cooling rates from annealing temperature to room temperature can be relatively high. However, as the diameters of the crystals increase, the path of conduction from the circumference of the crystals to the center of the crystals increases. As a result, the time required to complete the annealing process such that a desired birefringence level in the crystal is achieved also increases. Currently, there are demands for optical fluoride crystals with diameters of 300 mm or greater. Therefore, a process of annealing multiple large-diameter (crystal blank disk diameter>150 mm, preferably $\geq$250 mm, more preferably $\geq$300 mm) crystals within a reasonable time frame is desirable.

SUMMARY OF INVENTION

In one aspect, the invention relates to a method of making below 250-nm UV light transmitting optical fluoride lithography crystals which comprises (a) applying heat along a shortest path of conduction of a selected optical fluoride disk crystal, (b) heating the optical fluoride crystal to an annealing temperature, (c) holding the temperature of the optical fluoride crystal at the annealing temperature, and (d) gradually cooling the optical fluoride crystal to provide a low-birefringence optical fluoride crystal for transmitting below 250-nm UV light.

In another aspect, the invention relates to a method of making below 250-nm UV light transmitting optical fluoride lithography crystals which comprises (a) arranging a plurality of selected optical fluoride disk crystal in a single layer in a furnace, (b) applying heat along a shortest path of conduction of the selected optical fluoride crystals, (c)

heating the optical fluoride crystals to an annealing temperature, (d) holding the temperature of the optical fluoride crystals at the annealing temperature, and (e) gradually cooling the optical fluoride crystals to provide low-birefringence optical fluoride crystals for transmitting below 250-nm UV light.

In another aspect, the invention relates to a method of making below 250-nm UV light transmitting optical fluoride lithography crystals which comprises (a) providing optical fluoride disk crystals having birefringence values above 3 nm/cm, (b) applying heat along a shortest path of conduction of the optical fluoride disk crystals, (c) heating the optical fluoride crystals to an annealing temperature, (d) holding the temperature of the optical crystals at the annealing temperature, and (e) gradually cooling the optical fluoride crystals to provide optical fluoride crystals having birefringence value not higher than 3 nm/cm.

In another aspect, the invention relates to an apparatus for making low birefringence optical fluoride crystals which comprises a furnace, a chamber supported inside the furnace for containing at least one optical fluoride disk crystal, and at least one heater disposed external to the chamber, the heater being arranged to apply heat along a shortest path of conduction of the optical fluoride disk crystal.

In another aspect, the invention relates to an apparatus for annealing optical crystals which comprises a furnace, a chamber supported inside the furnace for containing at least an optical crystal, and at least a pair of heaters disposed external to the chamber, the heaters being arranged to provide heat along the shortest path of conduction of the optical crystal.

In another aspect, the invention relates to an apparatus for annealing optical crystals which comprises a furnace, a plurality of chambers supported inside the furnace for containing a plurality of optical crystals, and at least a pair of heaters disposed external to each chamber, the heaters being arranged to provide heat along the shortest path of conduction of the optical crystals.

In another aspect, the invention relates to an apparatus for annealing an optical crystal which comprises a chamber having a surface for supporting an optical crystal, at least one heater disposed external to the chamber, the heater being arranged to apply heat along a shortest path of conduction of the optical crystal, and means for enhancing exchange of radiation energy between the heater and the optical crystal.

Other features and advantages of the invention will be apparent from the following description and the appended claims.

DETAILED DESCRIPTION

Embodiments of the invention provide a method and an apparatus for annealing large-diameter crystals, particularly optical fluoride disk crystals. For example, crystals with a diameter of 300 mm or greater and diameter-to-thickness ratios of 3.0 or greater can be treated using the method and apparatus of the invention, preferably optical fluoride crystal disks. Smaller-diameter crystals can also take advantage of the benefits offered by the method and apparatus of the invention. The invention includes applying heat uniformly to and removing heat uniformly from the optical crystals along their shortest path of conduction. The shortest path of conduction is along the shortest dimension of the crystal. For a circular crystal having a diameter-to-thickness ratio greater than 1, the shortest path of conduction is along the thickness of the crystal. The following is a description of specific embodiments of the invention.

Figure 1B:
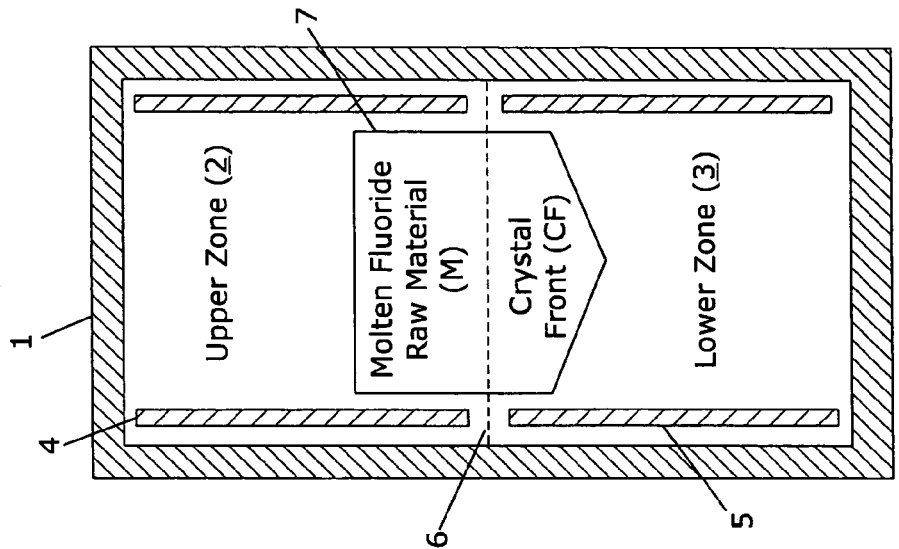
FIGS. 1A and 1B illustrate a prior-art process for growing an optical crystal.
Figure 1A:
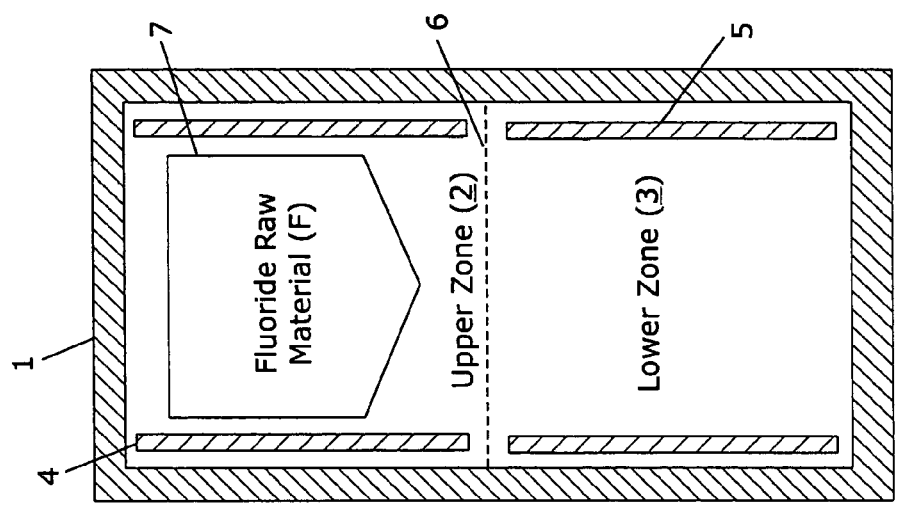
Figure 2A:
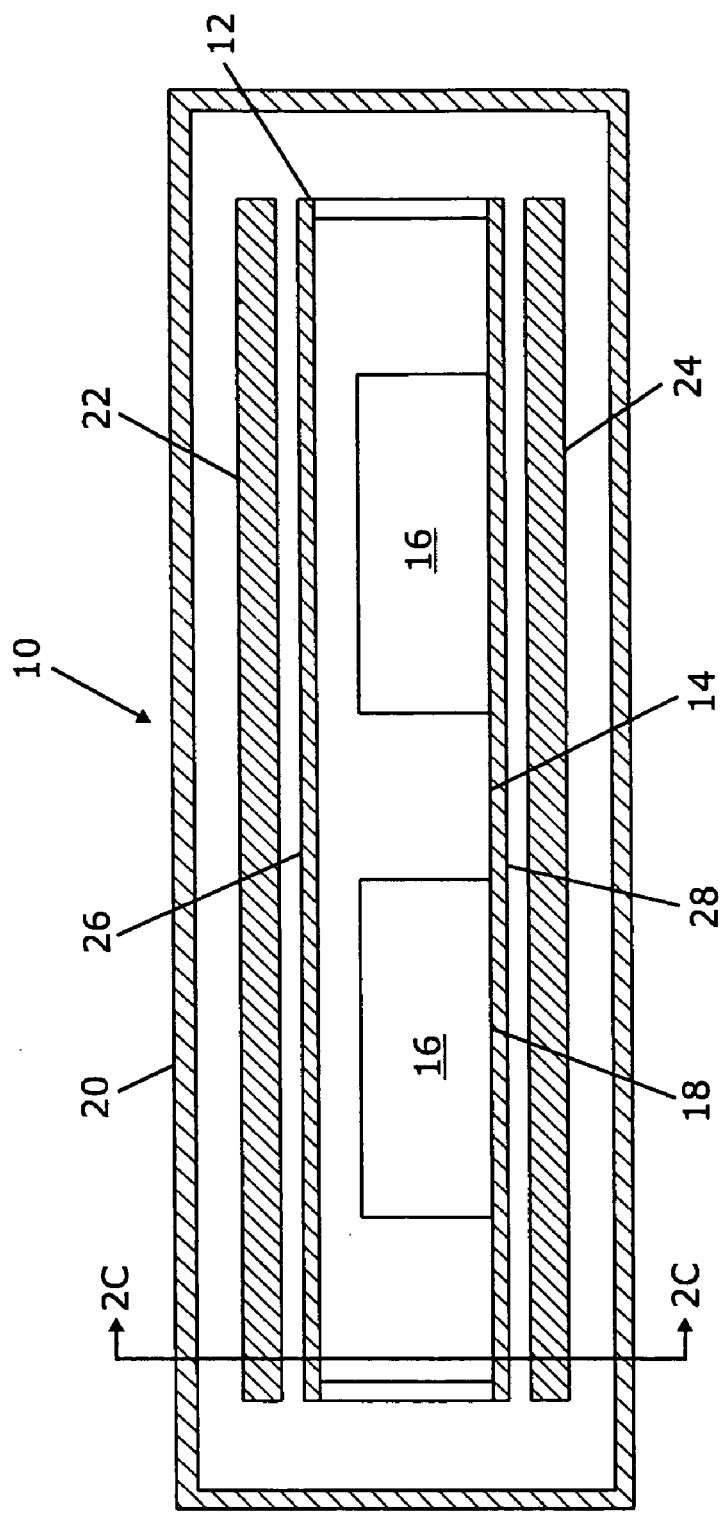
FIG. 2A shows a vertical cross-section of an annealing apparatus according to an embodiment of the invention.

FIG. 2A shows an annealing apparatus 10 according to one embodiment of the invention. The apparatus 10 includes a horizontal chamber (or vessel) 12 having a surface 14 for supporting one or more disk crystals 16. The horizontal chamber 12 is preferably unsealed, including not sealed hermetically, and can be gas permeable. The horizontal chamber 12 is made of an inert material, such as graphite, boron nitride, silicon carbide, or silicon nitride. The crystals 16 could be any type of optical fluoride crystal. For applications such as microlithography, fluoride crystals, such as single crystals of $CaF_2$, $BaF_2$, $SrF_2$, LiF, $MgF_2$, or NaF or mixed fluoride crystals made from solid solutions of these materials, are of interest.

For discussion purposes, the crystals 16 are assumed to be disk-shaped. However, the invention is not limited to disk-shaped crystals. In a preferred embodiment of the invention the optical fluoride crystals are disks. The crystals 16 are arranged in a single layer on the surface 14. The single-layer arrangement is preferred when the crystals 16 have large diameters, i.e., greater than 150 mm, and have a diameter-to-thickness ratio greater than 1. If the crystals 16 have small diameters, i.e., smaller than 150 mm, or have a diameter-to-thickness ratio less than 1, then it may be possible to arrange the crystals in more than one layer on the surface 14. In general, the crystals 16 should be arranged such that the majority (preferably at least 90%) of the heat that would be applied to them would be conducted along their shortest path of conduction, i.e., along their shortest dimension (diameter or thickness).

In the illustration, the bottom surfaces 18 of the crystals 16 are in direct contact with the surface 14 of the horizontal chamber 12. In alternate embodiments, the crystals 16 could be placed in crystal containers (not shown), which can then be supported on the surface 14 of the horizontal chamber 12. In alternate embodiments, as will be further described below, the bottom surfaces 18 of the crystals 16 may be spaced from the surface 14 of the horizontal chamber 12 to reduce or avoid contamination of the crystals 16 with the material used in constructing the horizontal chamber 12.

The horizontal chamber 12 is supported inside a furnace 20. Preferably, the support structure (not shown) for the horizontal chamber 12 is such that it does not cast thermal radiation "shadows" that can be detected on the inside of the horizontal chamber 12. Preferably, the furnace 20 is a vacuum furnace. The furnace 20 may be constructed of a water-cooled stainless steel casing or other suitable material. Preferably, the furnace 20 includes one or more ports (not shown) through which the atmosphere in the furnace 20 can be controlled. For example, the ports may be used for introducing atmosphere-controlling gases into the furnace 20 and for measuring the temperature and pressure in the furnace 20. Preferably, a gas purification/dryer system (not shown) is provided for removal of oxygen and moisture from process gases supplied into the furnace 20. Preferably, the moisture level in the furnace 20 is controlled to less than 1 ppb. Catalyst/Absorber/Getter systems may be used to remove moisture from the furnace atmosphere.

Figure 2B:
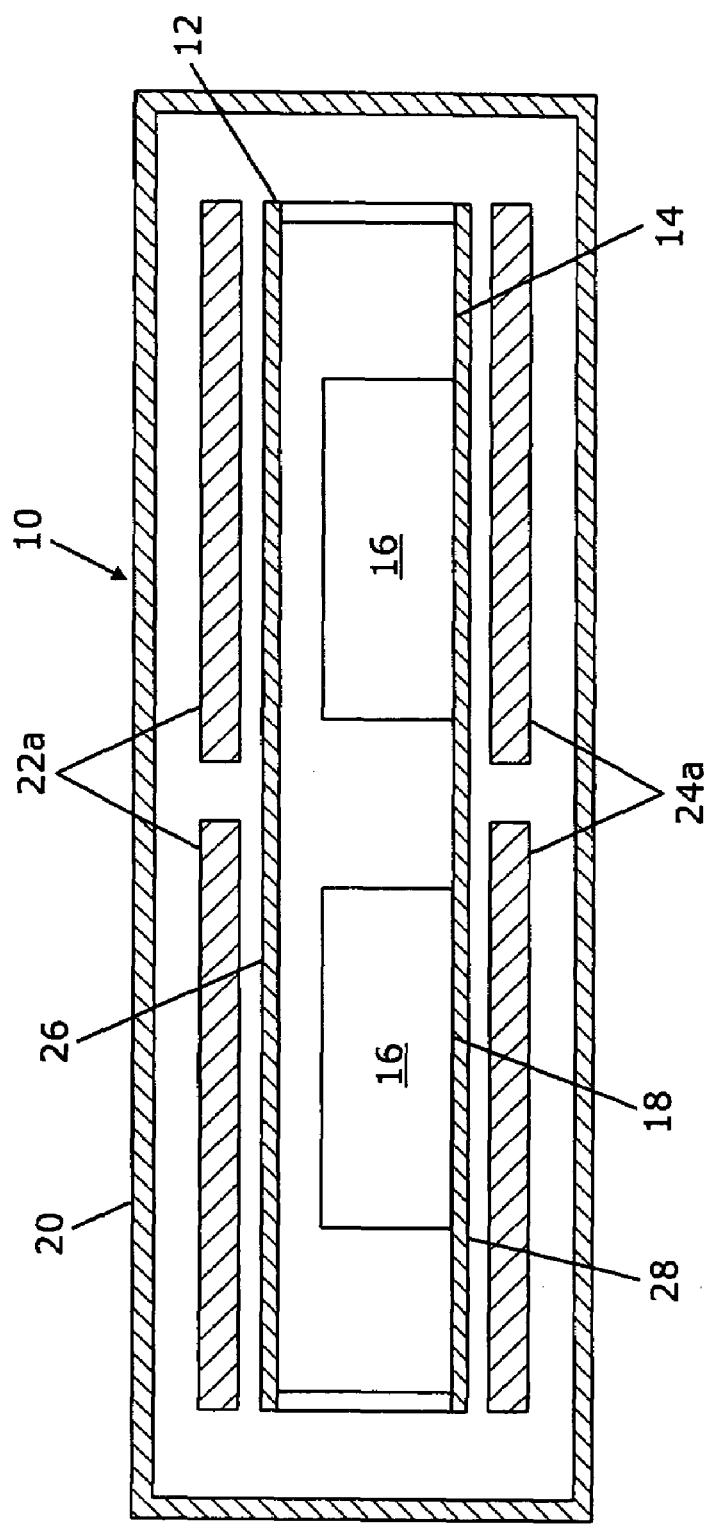
FIG. 2B shows multiple heating elements mounted parallel to the top and bottom surfaces of a horizontal annealing chamber.
Figure 2C:
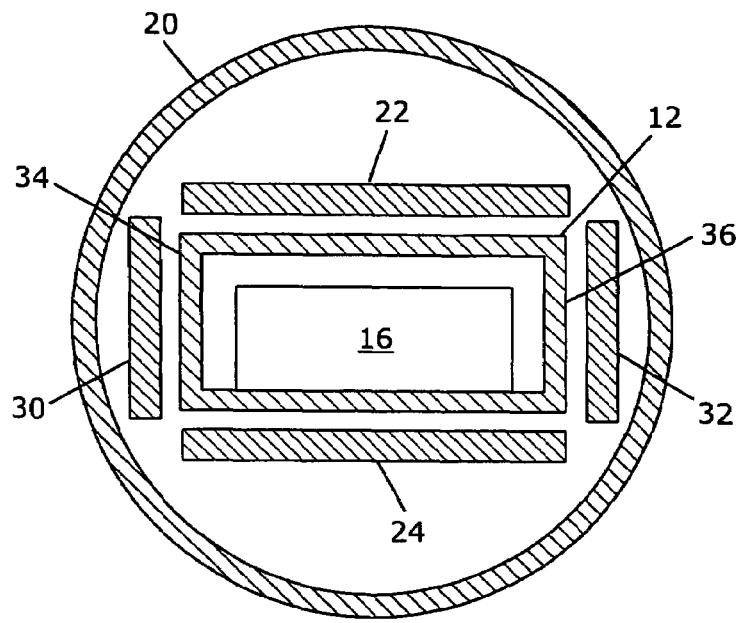
FIG. 2C shows heaters mounted parallel to the top, bottom, and side surfaces of a horizontal annealing chamber.
Figure 2D:
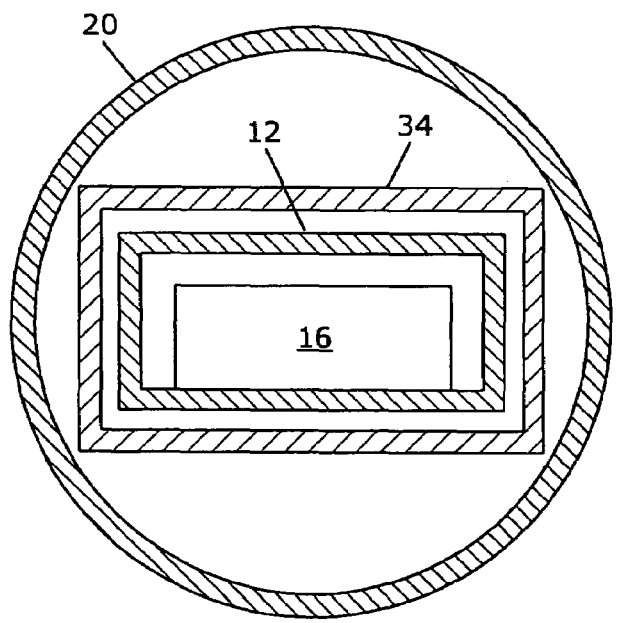
FIG. 2D shows a spiral heater circumscribing a horizontal chamber.

Inside the furnace 20, the horizontal chamber 12 is supported between heaters 22, 24. The heaters 22, 24 are generally parallel to the top and bottom surfaces 26, 28, respectively, of the horizontal chamber 12. The heaters 22, 24 may be resistance heating elements made of graphite or other suitable inert material. The heaters 22, 24 may be single heating elements. In other embodiments, such as shown in FIG. 2B, multiple heating elements 22a, 24a may be mounted parallel to the top and bottom surfaces 26, 28, respectively, of the horizontal chamber 12. Multiple heating elements allow for flexibility in controlling the temperature along the length of the horizontal chamber 12. In other embodiments, such as shown in FIG. 2C, heaters 30, 32 may be mounted parallel to the side surfaces 34, 36 of the horizontal chamber 12. In other embodiments, such as shown in FIG. 2D, the horizontal chamber 12 may be placed within one or more spiral heaters 34.

Returning to FIG. 2A, the heaters 22, 24 provide the majority of the heat used in bringing the crystals 16 from room temperature to annealing temperature. If the diameter-to-thickness ratio of the crystals 16 is greater than 1 and the crystals 16 are arranged in a single layer, then the heat generated by the heaters 22, 24 would be conducted along the shortest path of conduction of the crystals 16. Providing the majority of the heat along the shortest path of conduction of the crystals 16 would result in increased heating rates in comparison to the case where the crystals are arranged in a vertical stack. Also, the single-layer arrangement of the crystals 16 would allow the crystals 16 to be cooled evenly at increased cooling rate throughout the entire cooling portion of the annealing cycle. The single-layer arrangement of the crystals 16 would also allow for even distribution of process gases around the crystals 16.

Figure 3:
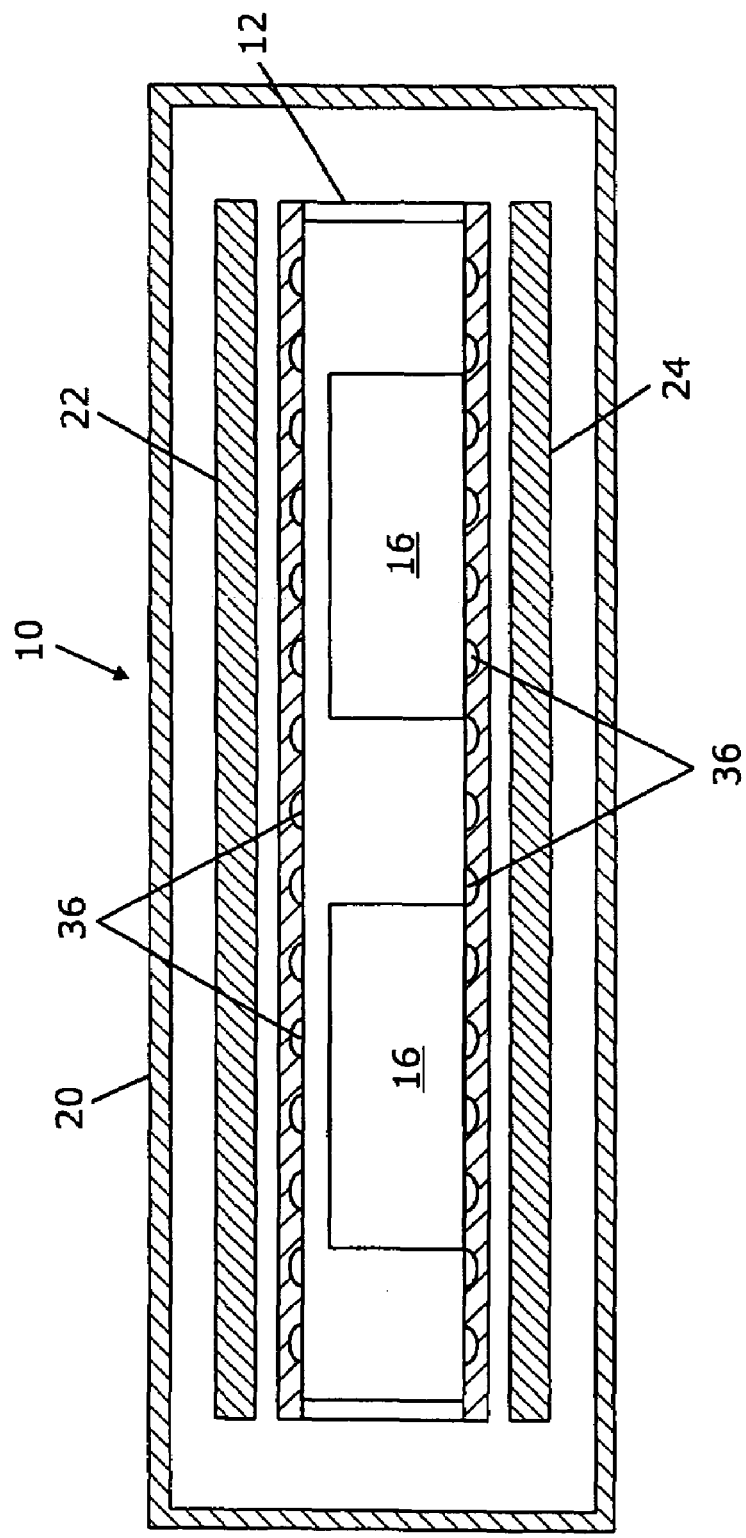
FIG. 3 shows depressions formed on the inside surfaces of a horizontal annealing chamber.

Radiation enhancements can be used to increase the radiation view factors on the crystals 16 and improve the overall temperature uniformity within the crystals 16. The term "radiation view factor" refers to the fraction of thermal energy leaving the surface of a first object and reaching the surface of a second object, determined entirely from geometrical considerations. In other words, the term "radiation view factor" on the crystal 16 refers to the fraction of the crystal 16 visible from the horizontal chamber 12. In one embodiment, the radiation enhancements include textures or shapes formed on the inside surfaces of the horizontal chamber 12. For example, FIG. 3 shows cup-shaped depressions 36 formed on the inside surfaces of the horizontal chamber 12. The sides of the depressions 36 would be at an angle sufficient to increase the radiation view factors on the crystals 16.

Figure 4A:
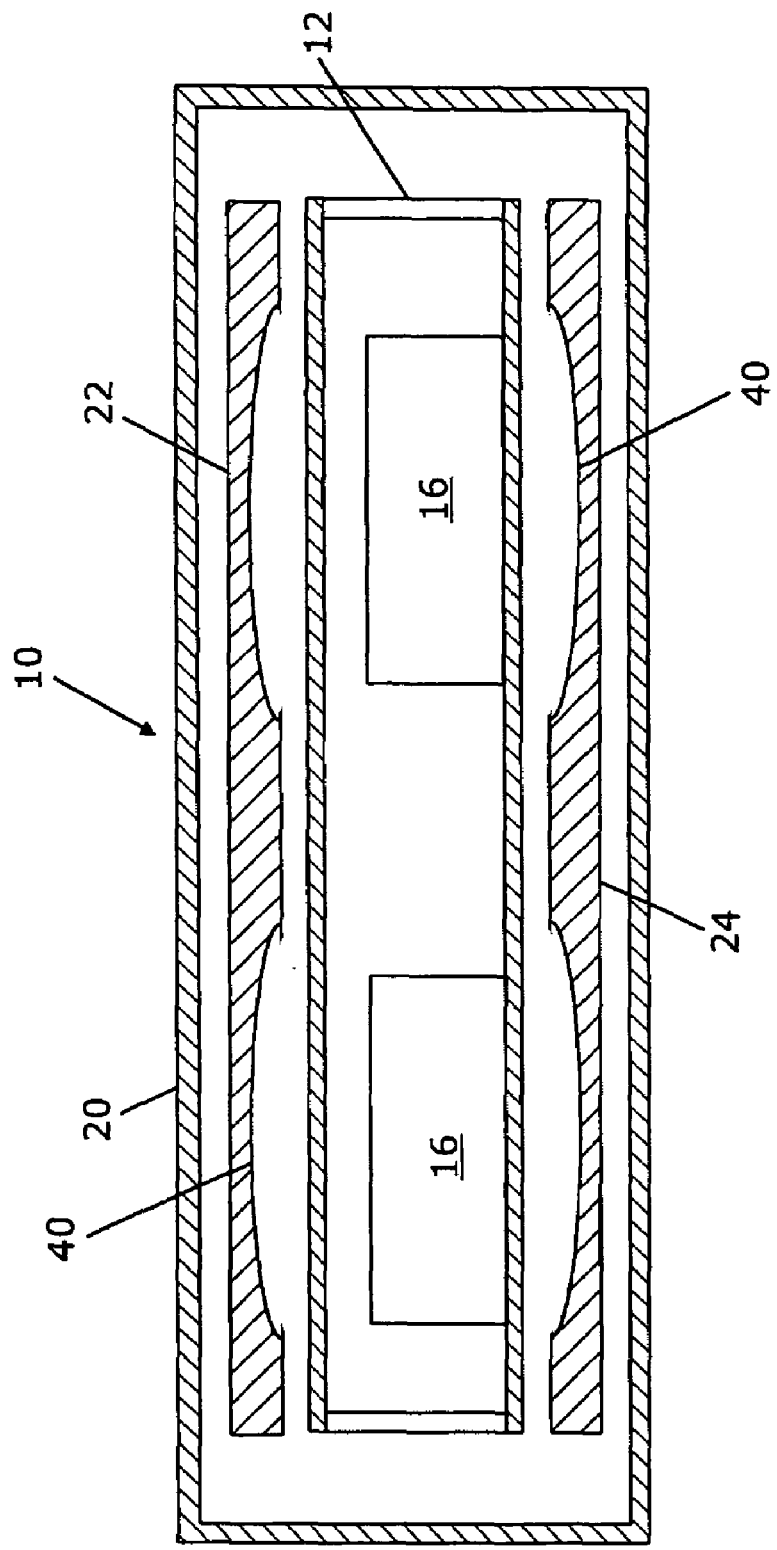
FIG. 4A shows heaters having concave surfaces mounted parallel to the top and bottom surfaces of a horizontal annealing chamber.
Figure 4B:
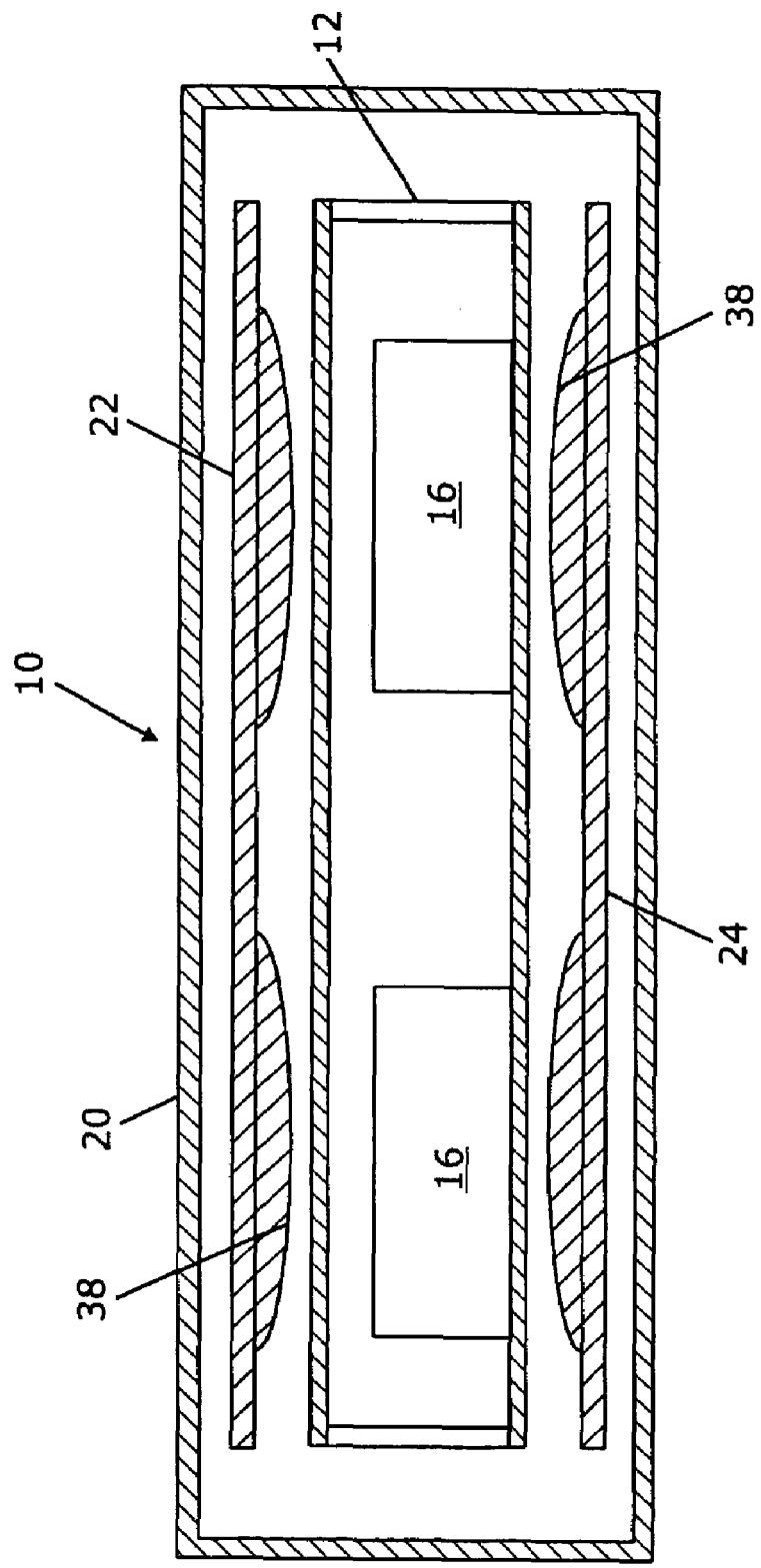
FIG. 4B shows heaters having convex surfaces mounted parallel to the top and bottom surfaces of a horizontal annealing chamber.

Radiation enhancements can also be used to apply more radiation energy to specific portions of the crystals 16 such that more uniform heating or cooling of the crystals 16 is achieved. As in the embodiment above, these radiation enhancements could be textures or shapes formed on the inside surfaces of the horizontal chamber 12 and/or heaters 22, 24. As an example, the radiation enhancements could be concave or convex shapes formed on the inside surfaces of the heaters 22, 24. FIG. 4A shows concave shapes 40 formed on the inside surface of the heaters 22, 24. The concave shapes 40 apply more radiation energy toward the center of the crystals 16, promoting even heating. FIG. 4B shows convex shapes 38 formed on the inside surface of the heaters 22, 24. The convex shapes 38, when centered over the crystals 16, apply more radiation energy toward the circumference of the crystals 16, promoting even cooling.

The annealing process starts with loading of the optical fluoride crystals 16 into the horizontal chamber 12, as shown in FIG. 2A. The horizontal chamber 12 is then loaded into the furnace 20. Typically, the horizontal chamber 12 is not sealed so that process gases can be passed over the crystals 16 as necessary. After loading the horizontal chamber 12 into the furnace 20, the furnace 20 is sealed, and the required atmosphere such as vacuum, inert, or fluorinating environment, is created inside the furnace 20. After creating the required atmosphere inside the furnace 20, the heating elements 22, 24 are operated such that the crystals 16 are heated to annealing temperature, typically a temperature below the melting point of the crystals 16. The heating process may include multiple heating and thermal hold segments. The crystals 16 are held at the annealing temperature for a predetermined length of time and then cooled at a controlled rate to room temperature. Typically, this cooling process involves slowly reducing the heat provided by the heaters 22, 24. During annealing, a control system (not shown) monitors and controls the atmosphere in the furnace 20 to a programmed level.

The following is an outline of an annealing process for calcium fluoride crystals using the apparatus of the invention. In particular, various modifications can be made to the heating and cooling schedules depending on the type of optical fluoride crystal treated and the birefringence level desired. The outline of the annealing process is as follows:

Load the horizontal chamber 12 inside the furnace 20 and seal the furnace 20.

Pump vacuum into the furnace 20 until vacuum pressure of $10^{-5}$ Torr is achieved.

Hold the furnace 20 at the vacuum pressure of $10^{-5}$ Torr for 30 minutes.

Backfill the furnace 20 with preheated nitrogen or argon or a mixture of nitrogen and argon at a continuous programmed rate of 5 volume exchanges per hour, where the temperature of the gas supplied matches the temperature of the furnace 20.

Heat the furnace 20 from room temperature to 300° C. in 5.5 hours with ±10° C. difference at any point outside of the chamber 12.

Hold the temperature of the furnace 20 at 300° C. for 1 hour with ±5° C. at any point outside of the chamber 12 by the start of the thermal hold.

At the beginning of the thermal hold, start pumping vacuum into the furnace 20 until vacuum pressure of $10^{-5}$ Torr is achieved.

Hold the furnace 20 at the vacuum pressure of $10^{-5}$ Torr for 30 minutes.

Backfill the furnace 20 with preheated nitrogen or argon or a mixture of nitrogen and argon at a continuous programmed rate of 5 volume exchanges per hour, where the temperature of the gas supplied matches the temperature of the furnace 20.

Heat the furnace 20 from 300° C. to 1200° C. in 18 hours with ±2.5° C. at any point on the outside of the chamber.

Hold the temperature of the furnace 20 at 1200° C. for 72 hours with ±1° C. difference at any point on the outside of the chamber 12 within 4 hours of the start of the thermal hold and continuing through the end of the hold at the same ±1° C. difference.

Cool the furnace 20 to 800° C. in 200 hours with ±1° C. difference at any point on the outside of the chamber 12 throughout this cooling range.

Hold the temperature of the furnace 20 at 800° C. for 24 hours with ±1° C. difference at any point on the outside of the chamber 12 through the end of the hold.

Cool the furnace 20 to room temperature in 150 hours with ±2.5° C. difference at any point on the outside of the chamber 12 throughout this entire cooling range.

Large-diameter crystals have large surface areas, which may result in increased friction drag between the crystals and the support surface of the horizontal chamber as the crystals expand and contract during the annealing process. Embodiments of the invention provide a method for reducing friction drag between the crystals and the support surface of the horizontal chamber during the annealing process.

Figure 5:
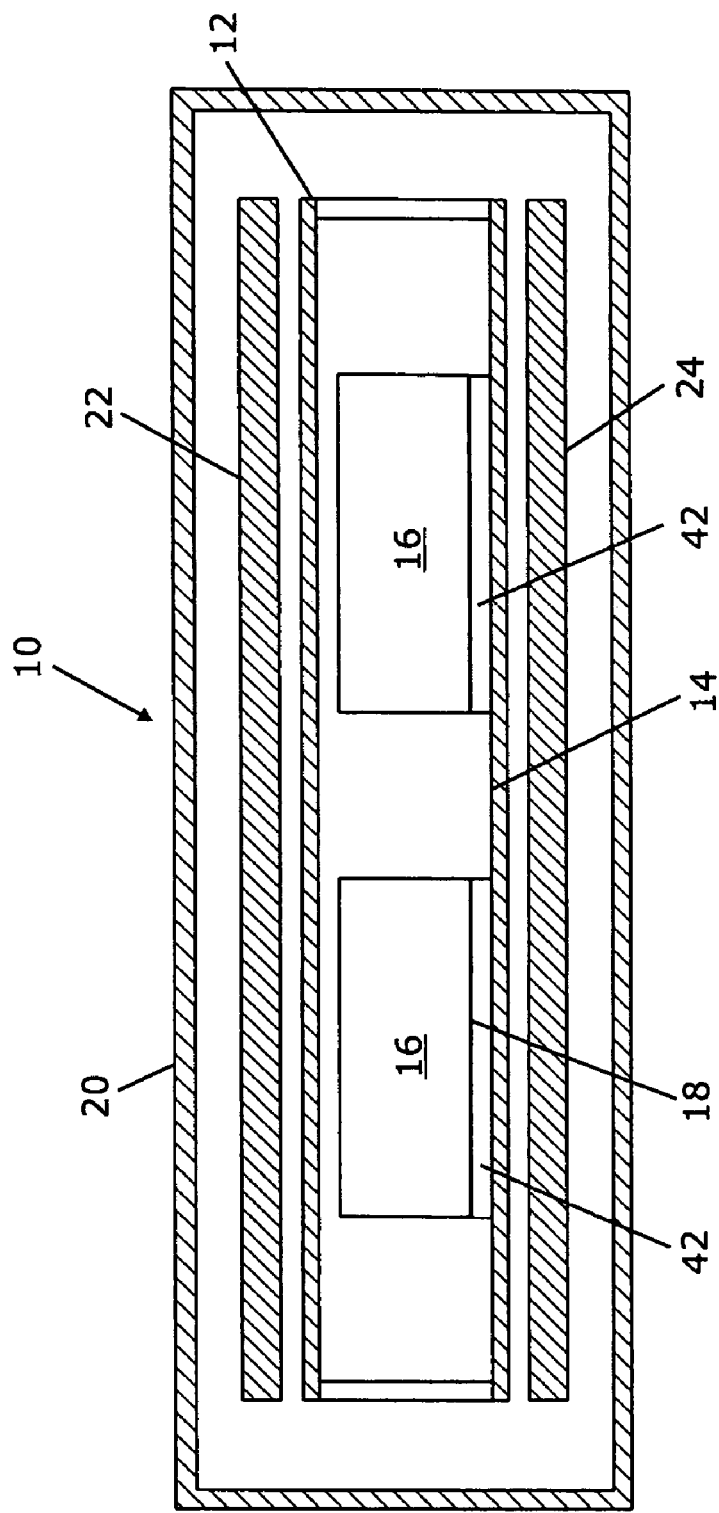
FIG. 5 shows a disk spacer interposed between the optical crystals and an inside surface of a horizontal annealing chamber.

FIG. 5 shows one method for reducing friction drag between the crystals 16 and the horizontal support surface 14 of the horizontal chamber 12 according to one embodiment of the invention. The method includes interposing sacrificial disks or spacers 42 between the crystals 16 and the support surface 14 of the horizontal chamber 12. Preferably, the spacers 42 are made of the same or similar fluoride crystal material as the optical fluoride crystals 16. The thickness of the spacers 42 can range from 0.125 to 1 in or more. In general, the surface friction between the crystals 16 and the fluoride crystal material spacers 42 is much less than would have been observed if the crystals 16 were in direct contact with the support surface 14 of the horizontal chamber 12.

One of the benefits of having the fluoride crystal material disks 42 between the crystals 16 and the support surface 14 of the horizontal chamber 12 is better cooling uniformity within the crystals 16. Better cooling uniformity is achieved because the crystals 16 are raised off the support surface 14 of the horizontal chamber 12. Raising the crystals 16 also reduces the effect of hot and cold temperature spots of the support surface 14 on the internal temperature of the crystals 16, allowing an overall uniform temperature within the crystals 16. The spacers 42 also eliminate or reduce contamination of the crystal surface by preventing direct contact between the crystals 16 and the horizontal chamber 12.

Figure 6:
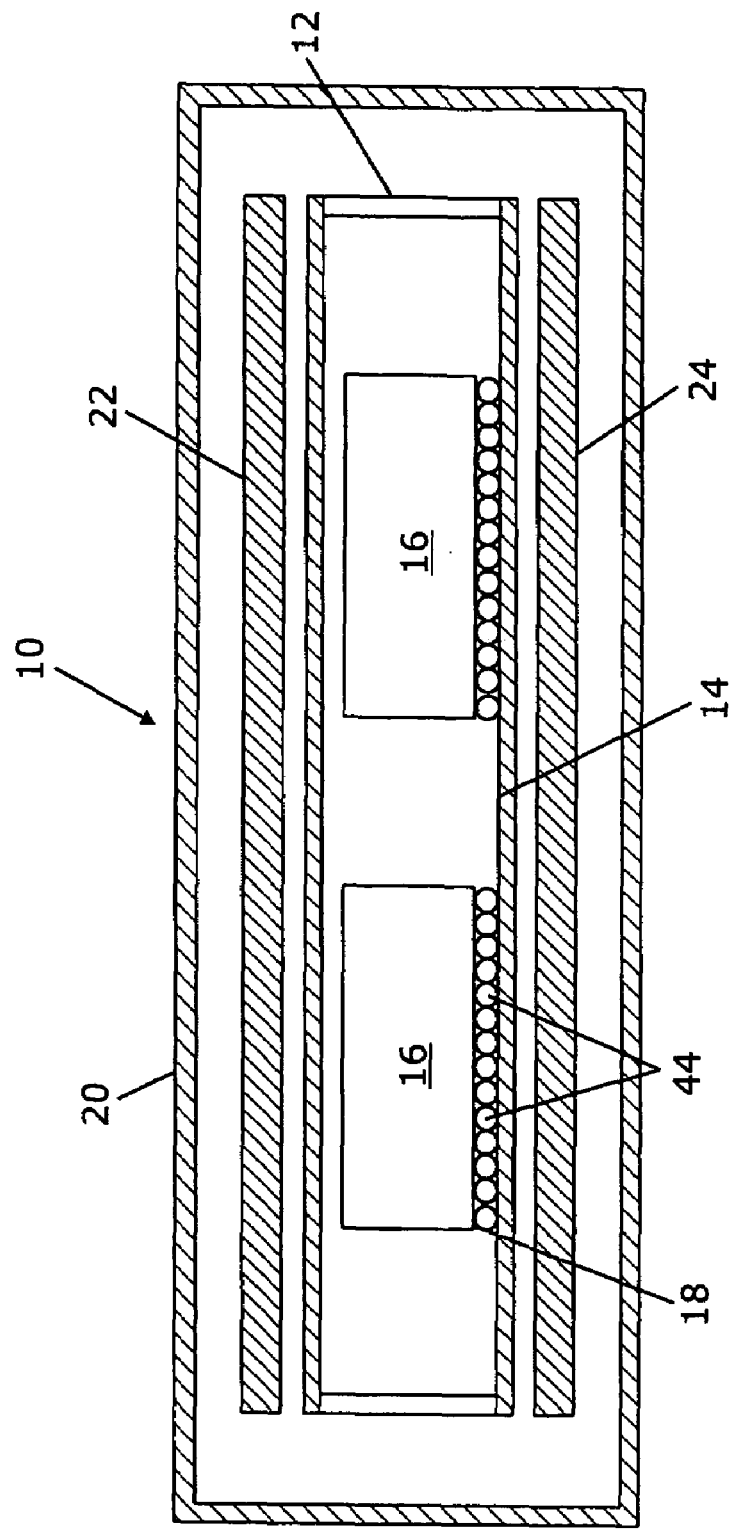
FIG. 6 shows multiple spherical spacers interposed between the optical crystals and a horizontal annealing chamber.

FIG. 6 shows another method for reducing friction drag between the crystals 16 and the support surface 14 of the horizontal chamber 12 according to an embodiment of the invention. The method includes placing loosely-packed round cross-section spheres 44 between the crystals 16 and the support surface 14 of the horizontal chamber 12. In general, spacers with round cross-sections, such as cylinders, could be packed between the crystals 16 and the support surface 14. The round cross-section spheres spacer rollers 44 could be made of high-grade, high-density inert material, such as graphite, or the same or similar fluoride crystal material as the optical crystals 16.

The round cross-section spheres spacer 44 reduce the contact area between the crystals 16 and the support surface 14 of the horizontal chamber 12, thus significantly reducing the surface friction and allowing the crystals 16 to thermally expand and contract freely. The spheres 44 also allow process gases to flow under the crystals 16 to provide a more homogeneous atmosphere environment to the surfaces of the crystals 16. This potential flow of gases under the crystals 16 mimics two-sided cooling, which allows for shorter cooling cycles and increased throughput. The increased surface area of the spheres 44 also increases the radiation view factors on the crystals 16, greatly reducing the impact of slight hot or cold temperature spots of the support surface 14 on the internal temperature of the crystals 16. The spheres 44 also reduce contamination of the crystal surface by preventing direct contact between the crystals 16 and the chamber 12.

Figure 7A:
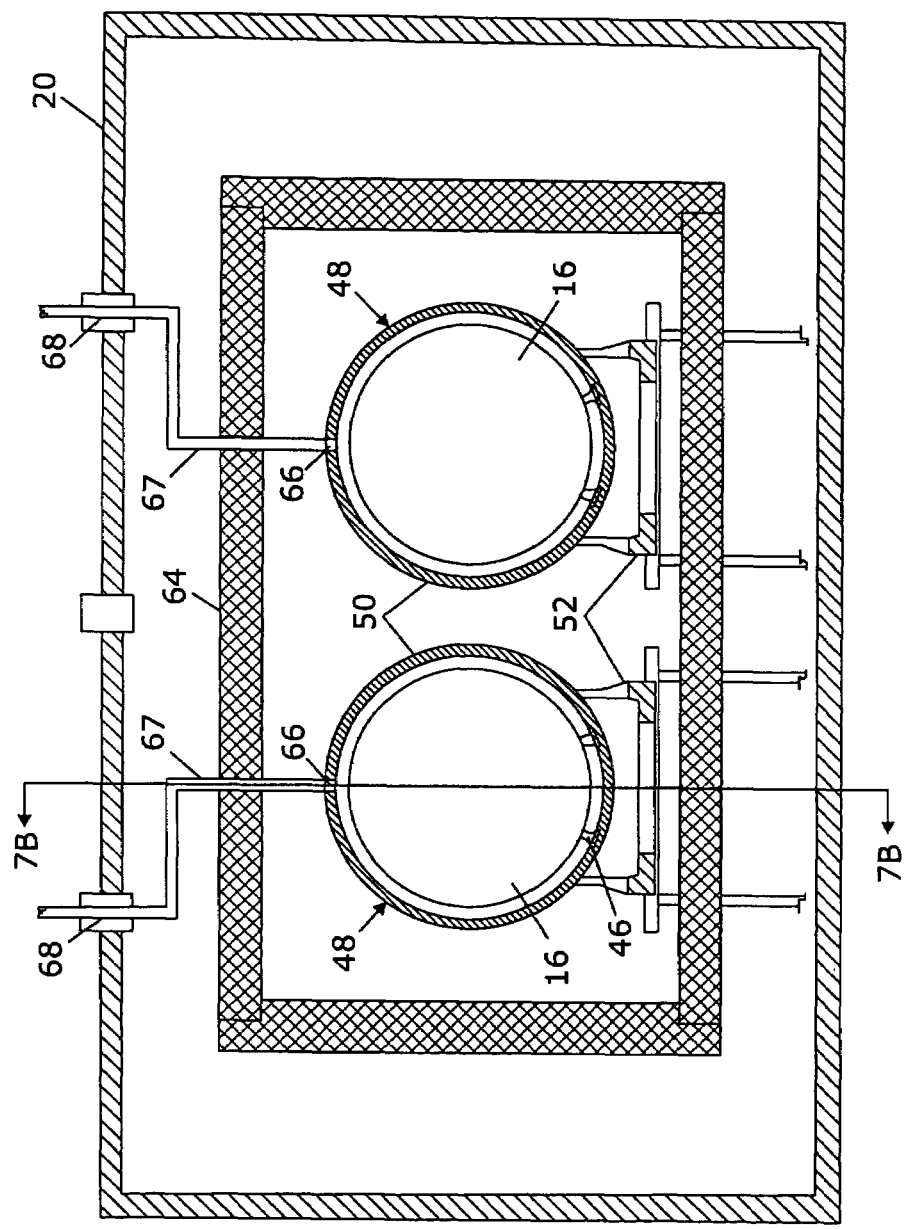
FIG. 7A shows optical crystals arranged in an edgewise (vertical) orientation within a furnace.

Those skilled in the art will appreciate that other crystal arrangements are possible which would allow heat to be conducted along the shortest path of conduction of the crystals. In other words, the invention is not limited to mounting the crystals 16 facedown (in a horizontal orientation) inside the horizontal chamber 12. For example, FIG. 7A shows an alternative arrangement where the crystals 16 are mounted in an edgewise (vertical) orientation inside vertical chambers 48. The crystals 16 are mounted on supports 46 inside the chambers 48. The circumferential edges 50 of the chambers 48 are in turn mounted on supports 52 inside the furnace 20. The vertical chambers 48 are shown as having a circular cross-section, but this is not a requirement for supporting the crystals 16 in an edgewise fashion. The vertical chambers 48 could be box-shaped, for example.

Figure 7B:
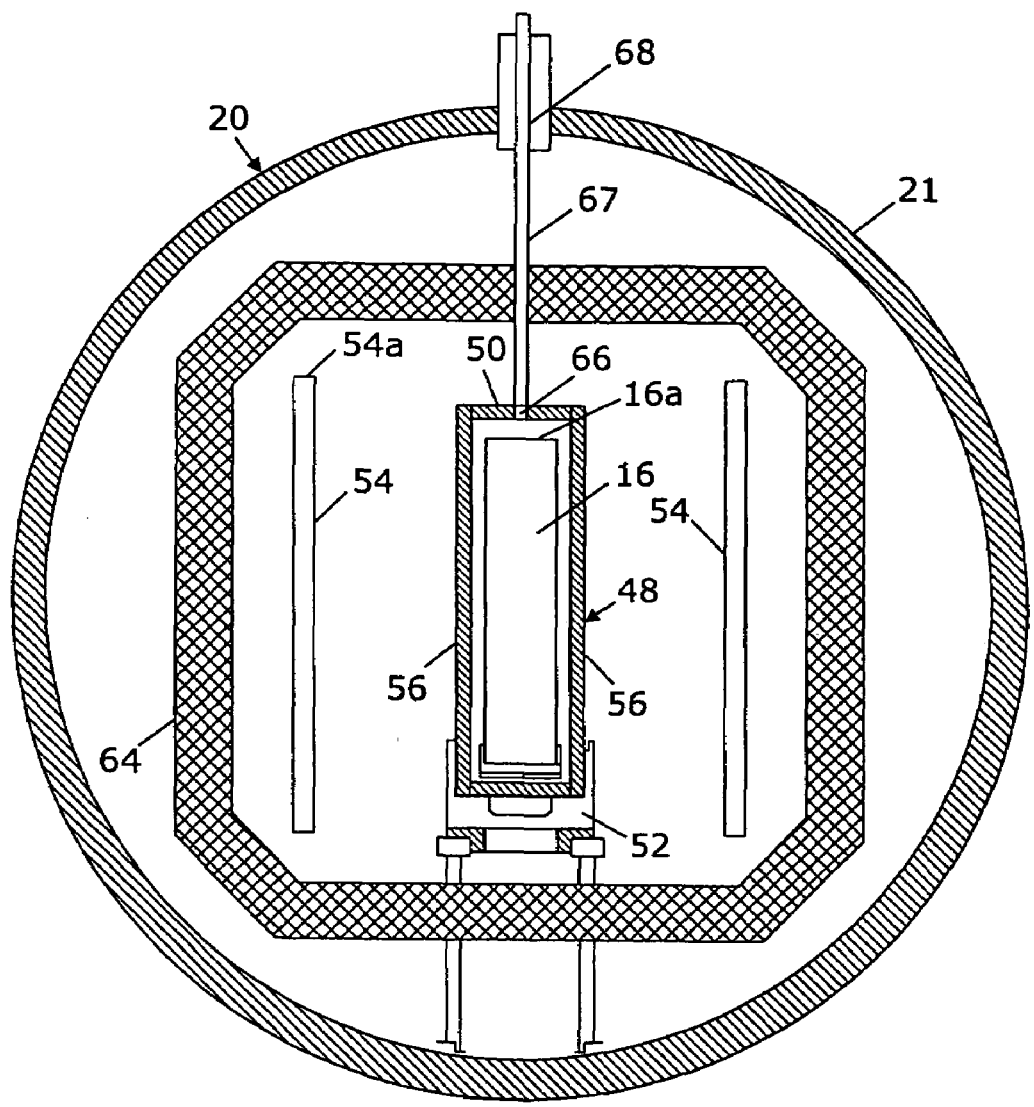
FIG. 7B shows a vertical cross-section of the annealing apparatus shown in FIG. 7A.

FIG. 7B shows a vertical cross-section of the arrangement shown in FIG. 7A. As illustrated, heating elements 54 are placed adjacent the vertical faces 56 of the chamber 48 to allow heat to be conducted along the shortest path of conduction of the crystal 16, i.e., along the thickness of the crystal 16. This assumes that the diameter-to-thickness ratio of the crystal 16 is greater than 1. The vertical faces 56 of the chamber 48 and/or the heaters 54 could include radiation-enhancing surfaces, such as previously described.

Preferably, the material used in making the chamber 48 is an inert material and is heat-resistant. In one embodiment, the vertical faces 56 of the chamber 48 are made of a material having a high thermal conductivity, and the circumferential edge 50 of the chamber 48 is made of a material having a low thermal conductivity. An example of a suitable material for making the vertical faces 56 is a graphite material having a thermal conductivity of 139 W/m.k. An example of a suitable material for making the circumferential edge 50 is a graphite material having a thermal conductivity of 50 W/m.k. The combination of low thermal conductivity and high thermal conductivity materials ensures that the majority of the heat applied to the chamber 48 is conducted along the shortest path of conduction of the crystal 16.

Figure 7C:
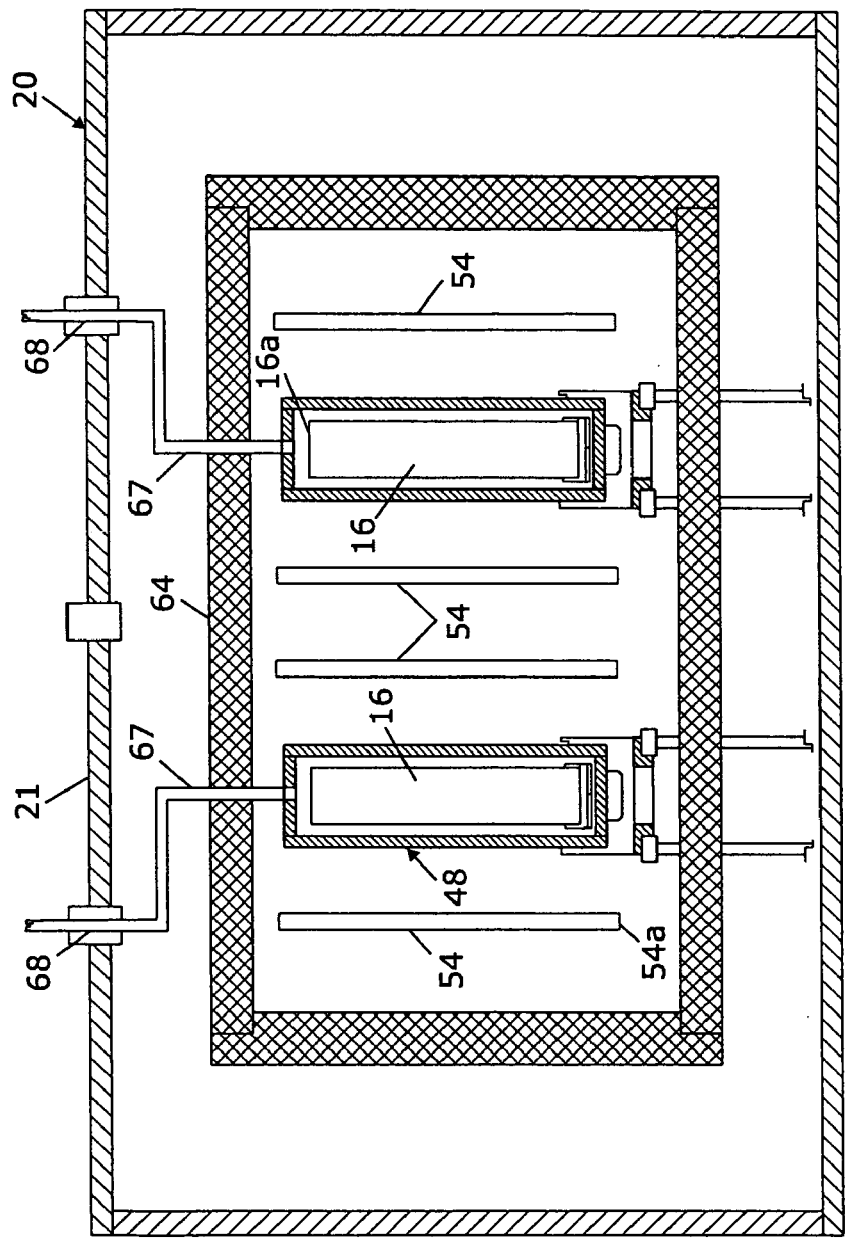
FIG. 7C shows optical crystals arranged in a vertical orientation within a furnace with the circumferential edges of the optical crystals having the same orientation as the round portion of the furnace.

The chamber 48 is mounted within an insulated chamber 64 inside the furnace 20 to allow for greater control of the heating and cooling rates of the crystal 16. It should be noted that the insulated chamber 64 does not have to be sealed. In the illustration, the crystal 16 and heating elements 54 are arranged such their circumferential edges 16a, 54a, respectively, are rotated 90 degrees with respect to the round portion 21 of the furnace 20. In another embodiment, such as shown in FIG. 7C, the crystal 16 and heating elements 54 could be rotated such that their circumferential edges 16a, 54a, respectively, have the same orientation as the round portion 21 of the furnace 20. In this way, heat will still be conducted along the shortest path of conduction of the crystal 16. This arrangement generally provides better heat uniformity across the crystal 16.

Figure 8A:
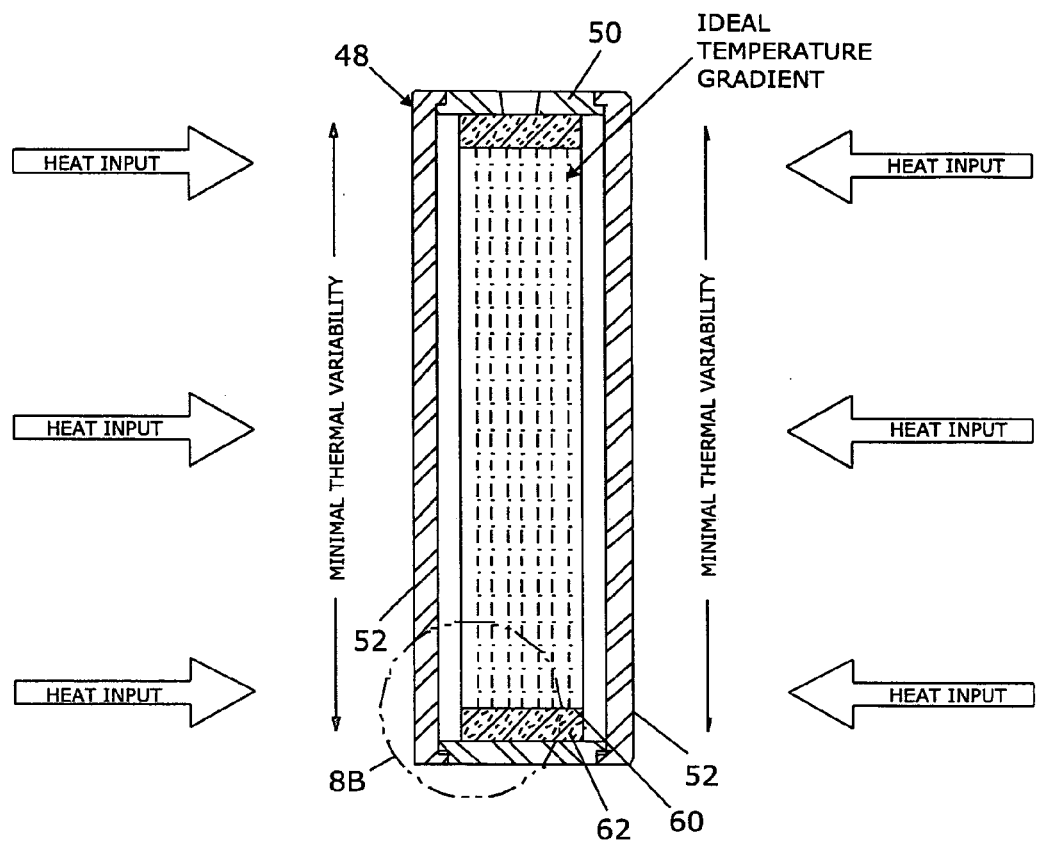
FIG. 8A shows a uniform temperature distribution within an optical crystal.
Figure 8B:
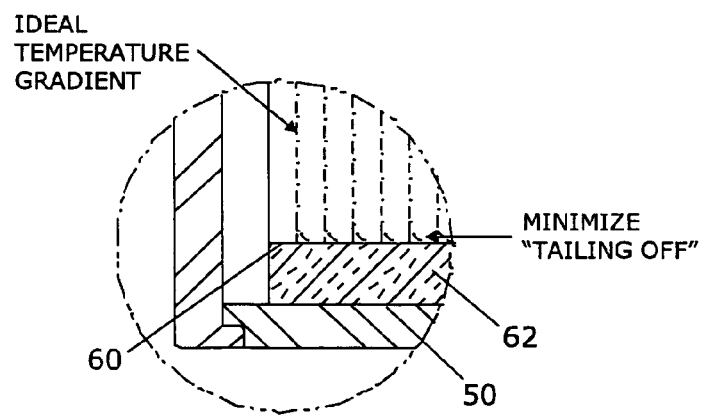
FIG. 8B shows a temperature distribution near the edge of an optical crystal.

It is desirable to have uniform heat distribution throughout the crystal 16. FIG. 8A shows the desired uniform temperature gradient field within the crystal 16. In reality, there will be some variation in the temperature distribution within the crystal 16, particularly near the circumferential edge 60 of the crystal 16. FIG. 8B shows the temperature gradient field "tailing off" near the circumferential edge 60 of the crystal 16. In one embodiment, this tailing off can be minimized by placing a crystal edge insulator insulation material 62, such as high purity graphite fiber, between the circumferential edge 50 of the chamber 48 and the circumferential edge 60 of the crystal 16. The insulation material 62 would prevent rapid heat loss at the circumferential edge 60 of the crystal 16 as well as assist in the distribution of the gases introduced into the chamber 48 at port 66. In another embodiment, localized heating can be applied near the circumferential edge 60 to minimize the tailing off.

Returning to FIG. 7A, the chamber 48 includes a port 66 through which process gases can be communicated to the crystal 16. In one embodiment, a fluid line 67 is connected to the port 66. The fluid line 67 passes through a port 68 in the furnace 20 to the exterior of the furnace 20. The fluid line 67 can be connected to a process gas system (not shown) external to the furnace 20, allowing independent control of the atmosphere within the chamber 48. For example, fluorinating gases are typically used to scavenge oxides from crystals. Instead of filling the furnace 20 with the fluorinating agent and having the agent then flow into the interior of chamber 48, the invention provides for the flow of the fluorinating agent first into the chamber 48, where the crystal 16 resides, to be filled with the fluorinating agent, with the fluorinating agent and any contaminant reaction products to gaseously exit the chamber 48 and into the furnace interior outside chamber 48, preferably so that there is a positive pressure of the fluorinating agent gas inside chamber 48 to sweep away gaseous reaction products (particularly scavenged oxides) to the exterior of chamber 48 and away from the optical fluoride crystals being annealed. Where multiple chambers 48 are loaded into the furnace 20, the connections 67 between the ports 66 in the chambers 48 and the exterior of the furnace 20 allow different atmospheric conditions to be maintained within the multiple chambers 48. Preferably chambers 48 are non-hermetic thereby allowing fluid communication between an interior of the chamber and an interior of the furnace.

Figure 9:
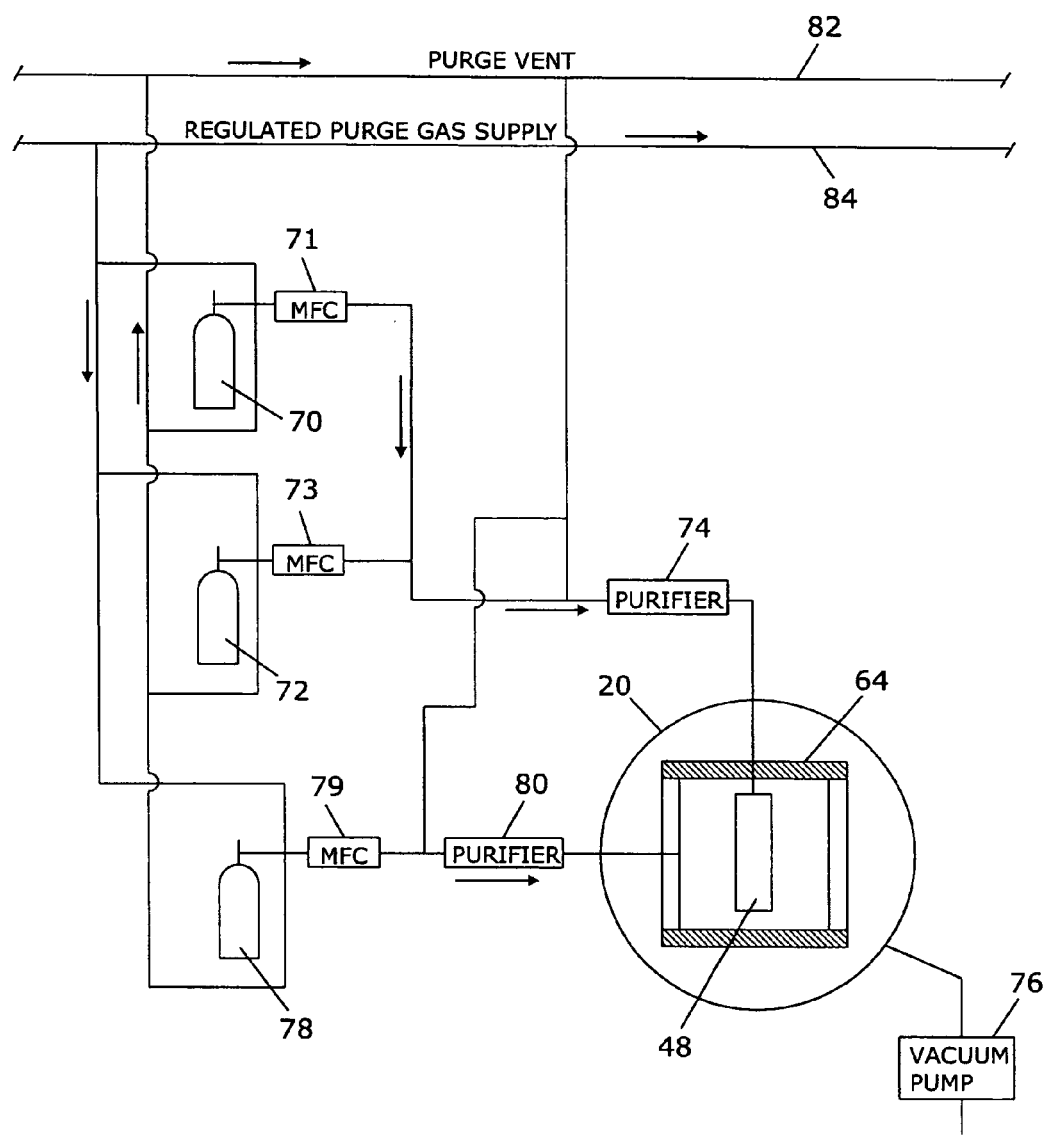
FIG. 9 shows a process gas system for use in an annealing process.

FIG. 9 shows a process gas system where the chamber 48 is connected to gas tanks 70, 72. The gas tanks 70, 72 could be sources of fluorinating gases, for example, or other process gases. The fluorinating gases could be mixed with inert gases. Mass flow controllers 71, 73 are used to control flow from the gas tanks 70, 72 into the chamber 48. A purifier 74 is provided to maintain a desired moisture level in the chamber 48.

The furnace 20 is connected to a gas tank 78. The gas tank 78 could be a source of an inert gas, such as argon. This would allow an inert atmosphere to be maintained inside the furnace 20 during the annealing process. A mass flow controller 79 is used to control flow from the gas tank 78 into the furnace 20. A purifier 80 is provided to maintain a desired moisture level in the furnace 20. A vacuum pump 76 maintains vacuum in the furnace 20 as necessary.

Although not shown, the process gas system also includes various valves and regulators to control gas flow through the system. A control system (not shown) may be used to control the mass flow controllers, valves, regulators, purifiers, and vacuum pump such that the desired atmospheric conditions are achieved inside the furnace 20 and chamber 48. A purge vent 82 allows gas to be purged out of the chamber 48 and furnace 20 as necessary. A purge gas supply line 84 carries purge gas to the chamber 48 and furnace 20 as necessary.

Figure 10:
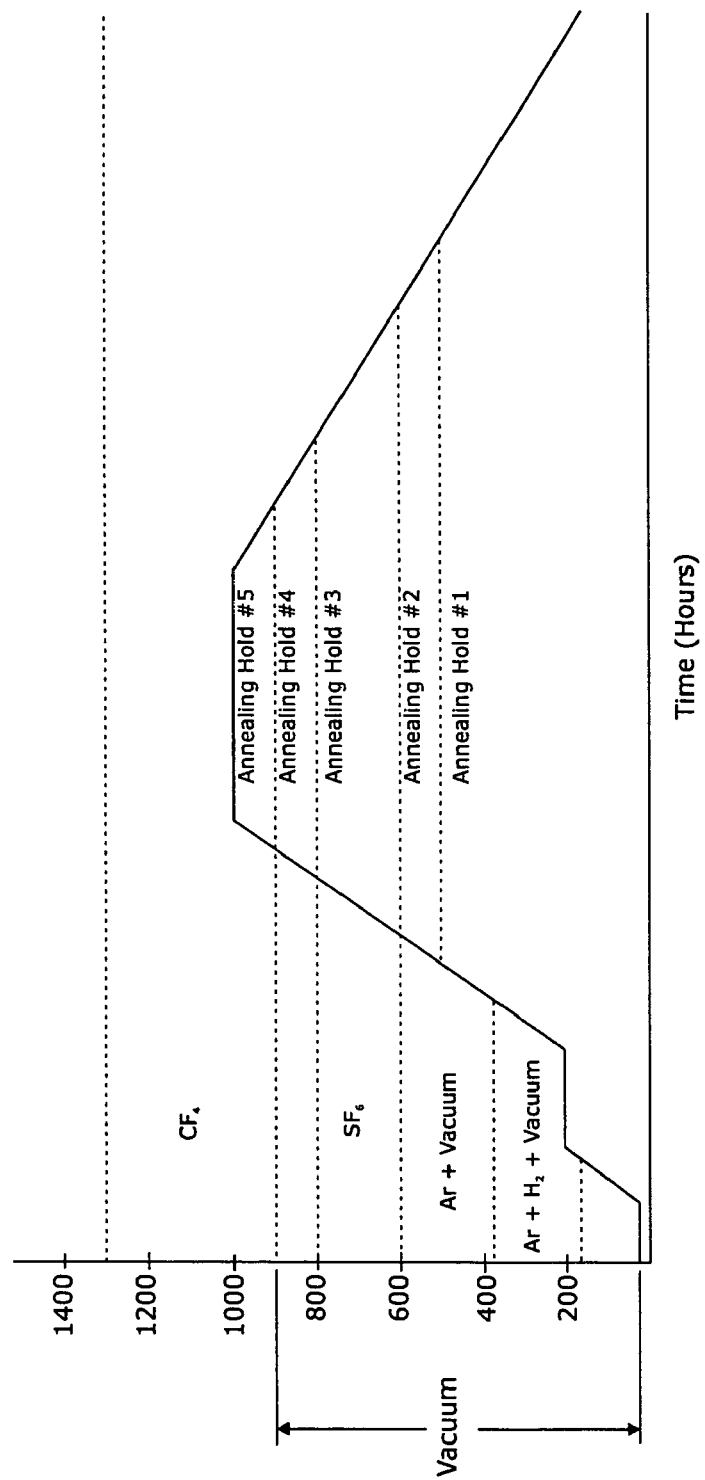
FIG. 10 shows an annealing cycle illustrating gas selection.

The process gas system shown in FIG. 9 allows gases to be supplied to and purged from the chamber 48 and furnace 20 independently. FIG. 10 shows an example of an annealing cycle for calcium fluoride crystals using the process gas system shown in FIG. 9. The annealing cycle shows various types of gases that may be selected and introduced into the chamber 48 and furnace 20 at various times during the annealing process. Fluorinating gases, such as $SF_6$ and $CF_4$, are introduced into the chamber 48 at temperatures where they are most effective in scavenging oxides from the calcium fluoride crystal. Other examples of fluorinating gases that may be used include $NF_3$, $BF_3$, $C_2F_4$, and $F_2$.

As can be appreciated from the discussion above, the invention provides one or more advantages. Specifically, the invention allows heat to be distributed uniformly to one or more crystal disks, e.g., optical fluoride crystals, along the shortest path of conduction of the crystals during an annealing process. The invention also allows heat to be removed uniformly from the crystals during the annealing process. The results are annealed crystals having low birefringence values and shorter annealing cycles.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for making low birefringence optical fluoride crystals, comprising:
   a furnace;
   one or a plurality of chambers supported inside the furnace for containing at least one optical fluoride crystal, said chambers having a surface for supporting an optical fluoride crystal; and
   at least one heater disposed external to the one or plurality of chambers, the heater being arranged to apply heat along a shortest path of conduction of the optical fluoride crystal, and
   a plurality of ports in said furnace for the optional use of temperature probes, gas entry and exit, and the application of vacuum;

wherein:
(a) said chambers are unsealed, thereby allowing gas communication between an interior of the chamber and an interior of the furnace, and
(b) said optical fluoride crystal oriented in either;
  (i) a facedown orientation on the surface within said chamber or
  (ii) an edgewise orientation on the surface within said chamber.

2. The apparatus of claim 1, wherein the heater and/or the chamber is provided with textured surface for enhancing the exchange of radiation between the heater and/or chamber and the crystal.

3. The method according to claim 2, wherein the heater texture surface comprises a concave shape or a convex shape.

4. The apparatus of claim 2, wherein the chamber textures surface comprises a plurality of depressions on the surface of said chamber adjacent the optical fluoride crystal.

5. The apparatus of claim 1, further comprising that when said crystal is in a facedown orientation, a spacer for preventing direct contact between the optical crystal and a surface of the chamber.

6. The apparatus according to claim 5, wherein the spacer comprises loosely-packed round cross-section spheres.

7. The apparatus according to claim 5, wherein the spacer comprises cylinders.

8. The apparatus of claim 1, wherein the optical crystal is supported in an edgewise orientation within the furnace by an apparatus and a portion of the chamber adjacent a face of the optical crystal has a higher thermal conductivity than a portion of the chamber adjacent an edge of the optical crystal.

9. The apparatus of claim 1, wherein the optical crystal is supported in an edgewise orientation within the furnace by an apparatus and a portion of the chamber adjacent a face of the optical crystal has a higher thermal conductivity than a portion of the chamber adjacent an edge of the optical crystal.

10. An apparatus for making low birefringence optical fluoride crystals, comprising:
a furnace;
one or a plurality of chambers supported inside the furnace for containing at least one optical fluoride crystal, said chambers having a surface for supporting an optical fluoride crystal;
at least a pair of heaters disposed external to each chamber, the heaters being arranged to apply heat along a shortest path of conduction of the optical fluoride crystal, and
a plurality of ports in said furnace for the optional use of temperature probes, gas entry and exit, and the application of vacuum;
wherein said chambers are unsealed, thereby allowing gas communication between the interior of the chamber and the interior of the furnace.

11. The apparatus according to claim 10, wherein the surface for supporting an optical fluoride crystal is a textured surface for enhancing the exchange of radiation between the heater and/or chamber and the crystal.

12. The apparatus according to claim 10, wherein the apparatus further comprises a spacer that is positioned between the chamber support surface and an optical fluoride crystal with said chamber.

13. The apparatus according to claim 12, wherein the spacer is made of an inert material.

14. The apparatus according to claim 12, wherein the spacer is made of graphite or a fluoride crystal material that is the same as or similar to an optical fluoride crystal contained therein.

15. The apparatus according to claim 10, wherein the chamber textured surface comprises a plurality of depressions on the surface of said chamber adjacent the optical fluoride crystal.

16. The apparatus according to claim 10, wherein the heater texture surface comprises a concave shape or a convex shape.

17. The apparatus according to claim 10, wherein said at least a pair of heaters comprises a spiral heater.

* * * * *